US011961748B2

(12) United States Patent
Yun et al.

(10) Patent No.: US 11,961,748 B2
(45) Date of Patent: Apr. 16, 2024

(54) SUPPORT UNIT AND SUBSTRATE TREATING APPARATUS INCLUDING THE SAME

(71) Applicant: SEMES CO., LTD., Cheonan-si (KR)

(72) Inventors: Kangseop Yun, Cheonan-si (KR); Youngil Lee, Cheonan-si (KR); Jungbong Choi, Suwon-si (KR)

(73) Assignee: Semes Co., LTD., Cheonan-si (KR)

( * ) Notice: Subject to any disclaimer, the term of this patent is extended or adjusted under 35 U.S.C. 154(b) by 0 days.

(21) Appl. No.: 17/380,339

(22) Filed: Jul. 20, 2021

(65) Prior Publication Data

US 2022/0028708 A1    Jan. 27, 2022

(30) Foreign Application Priority Data

Jul. 24, 2020    (KR) .......................... 10-2020-0092023

(51) Int. Cl.
*H01L 21/67*           (2006.01)
*H01L 21/687*        (2006.01)

(52) U.S. Cl.
CPC .... *H01L 21/67115* (2013.01); *H01L 21/6708* (2013.01); *H01L 21/68714* (2013.01)

(58) Field of Classification Search
None
See application file for complete search history.

(56) References Cited

U.S. PATENT DOCUMENTS

| | | | | |
|---|---|---|---|---|
| 5,651,827 A | * | 7/1997 | Aoyama | C03B 19/095 118/725 |
| 6,080,965 A | * | 6/2000 | Osawa | H01L 21/67115 219/390 |
| 10,490,427 B2 | | 11/2019 | Choi et al. | |
| 2015/0034133 A1 | * | 2/2015 | Kim | H01L 21/67051 134/105 |
| 2016/0013079 A1 | * | 1/2016 | Choi | H01L 21/67051 156/345.21 |
| 2019/0311923 A1 | * | 10/2019 | Kim | H01L 21/6708 |
| 2021/0050235 A1 | * | 2/2021 | Yun | H01L 21/67115 |
| 2021/0104420 A1 | * | 4/2021 | Choi | H01L 21/68728 |
| 2022/0028708 A1 | * | 1/2022 | Yun | H01L 21/67115 |
| 2022/0159788 A1 | * | 5/2022 | Kim | H01L 21/6875 |
| 2022/0181168 A1 | * | 6/2022 | Yun | H01L 21/68728 |

FOREIGN PATENT DOCUMENTS

| | | | | |
|---|---|---|---|---|
| CN | 110349885 A | * | 10/2019 | ....... H01L 21/67051 |
| JP | H1197370 A | * | 4/1999 | |
| KR | 10-2013-0074562 A | | 7/2013 | |
| KR | 10-2014-0047564 A | | 4/2014 | |

(Continued)

OTHER PUBLICATIONS

Machine Generated English of the claims of KR20140047564A. Published Apr. 22, 2014. (Year: 2014).*

(Continued)

*Primary Examiner* — Sylvia MacArthur
(74) *Attorney, Agent, or Firm* — HARNESS, DICKEY & PIERCE, P.L.C.

(57) ABSTRACT

A support unit for supporting a substrate includes a heating member and a reflector, and the reflector includes a curved surface that reflects thermal energy generated by the heating member toward an edge region of the substrate.

18 Claims, 13 Drawing Sheets

(56) References Cited

FOREIGN PATENT DOCUMENTS

| KR | 10-2016-0008065 A | 1/2016 |
|---|---|---|
| KR | 10-2017-0026901 A | 3/2017 |
| KR | 101757813 B1 | 7/2017 |
| KR | 10-2019-0117373 A | 10/2019 |

OTHER PUBLICATIONS

Machine Generated English of the description of KR20140047564A. Published Apr. 22, 2014. (Year: 2014).*
Korean Office Action dated Feb. 1, 2023 issued in corresponding Korean Appln. No. 10-2020-0092023.
Japanese Office Action dated Sep. 6, 2022 issued in corresponding Japanese Appln. No. 2021-118513.
Korean Notice of Allowance dated Jun. 13, 2023 issued in Korean Patent Application No. 10-2020-0092023.

* cited by examiner

SUPPORT UNIT AND SUBSTRATE TREATING APPARATUS INCLUDING THE SAME

CROSS-REFERENCE TO RELATED APPLICATIONS

A claim for priority under 35 U.S.C. § 119 is made to Korean Patent Application No. 10-2020-0092023 filed on Jul. 24, 2020, in the Korean Intellectual Property Office, the entire contents of which are hereby incorporated by reference.

BACKGROUND

Embodiments of the inventive concept described herein relate to a support unit and a substrate treating apparatus, and more particularly, relate to a support unit for performing a substrate treating process while heating a substrate, and a substrate treating apparatus including the support unit.

In general, various processes, such as a photoresist coating process, a developing process, an etching process, an ashing process, and the like, are performed to treat a glass substrate or a wafer in a process of manufacturing flat panel display devices or semiconductor elements. In each of the processes, a wet cleaning process using a chemical or deionized water and a drying process for drying the chemical or the deionized water remaining on a surface of a substrate are performed to remove various contaminants adhering to the substrate.

In recent years, an etching process of selectively removing a silicon nitride film and a silicon oxide film using a chemical, such as a sulfuric acid or a phosphoric acid, at high temperature has been used. In a substrate treating apparatus using a high-temperature chemical, a substrate treating apparatus for heating a substrate is used to improve an etch rate. One example of the substrate treating apparatus is disclosed in U.S. Patent Publication No. 2016-0013079. The substrate treating apparatus disclosed in U.S. Patent Publication No. 2016-0013079 has, inside a spin head, a lamp for heating a substrate and a reflector for reflecting heat radiated from the lamp. However, when a substrate is treated by using the substrate treating apparatus, efficiency in treating an edge region of the substrate is relatively lowered. Specifically, this is because the number of lamps contributing to heating the edge region of the substrate is smaller than the number of lamps contributing to heating a central region of the substrate. In other words, when the substrate is treated by using the substrate treating apparatus, treating efficiency for the edge region of the substrate is lower than treating efficiency for the central region of the substrate, and thus treating uniformity for the entire substrate is lowered. The treating uniformity for the entire substrate is a very important factor in terms of yield, and therefore an improvement in heat treatment of the edge region of the substrate is required. To improve heat treatment of the edge region of the substrate, a method using a separate heat source (e.g., a laser irradiation member) that supplies thermal energy to the edge region of the substrate may be considered. However, this method may cause a rise in facility cost and may be inefficient due to a spatial limitation.

SUMMARY

Embodiments of the inventive concept provide a support unit for efficiently treating a substrate and a substrate treating apparatus including the support unit.

Furthermore, embodiments of the inventive concept provide a support unit for improving uniformity in treating a substrate and a substrate treating apparatus including the support unit.

Moreover, embodiments of the inventive concept provide a support unit for improving efficiency in treating an edge region of a substrate and a substrate treating apparatus including the support unit.

In addition, embodiments of the inventive concept provide a support unit for improving an etch rate for an edge region of a substrate and a substrate treating apparatus including the support unit.

The technical problems to be solved by the inventive concept are not limited to the aforementioned problems, and any other technical problems not mentioned herein will be clearly understood from the following description by those skilled in the art to which the inventive concept pertains.

According to an embodiment, a support unit for supporting a substrate includes a heating member and a reflector, and the reflector includes a curved surface that reflects thermal energy generated by the heating member toward an edge region of the substrate.

According to an embodiment, the curved surface may form part of a virtual ellipse when the support unit is viewed from the front.

According to an embodiment, the virtual ellipse may have a first focal point and a second focal point, and the heating member may be located to overlap one of the first focal point and the second focal point when viewed from the front.

According to an embodiment, the edge region of the substrate may overlap the other one of the first focal point and the second focal point when viewed from the front.

According to an embodiment, the heating member may include one or more lamps that emit light to heat the substrate.

According to an embodiment, at least some of the lamps may have ring shapes with different radii and may be concentric with one another.

According to an embodiment, the reflector may include a base disposed under the heating member and a protrusion protruding upward from the base, and the base and/or the protrusion may include the curved surface.

According to an embodiment, the protrusion, when viewed from above, may be disposed between the outermost lamp among the lamps and a lamp adjacent to the outermost lamp.

According to an embodiment, the protrusion may include a first protrusion including a first curved surface that reflects the thermal energy toward a first position on the edge region of the substrate and a second protrusion including a second curved surface that reflects the thermal energy toward a second position on the edge region of the substrate, the second position being different from the first position.

According to an embodiment, the first curved surface may form part of a first virtual ellipse when viewed from the front, and the second curved surface, when viewed from the front, may form part of a second virtual ellipse having different focal points from the first virtual ellipse.

According to an embodiment, the support unit may further include a chuck that supports the substrate and a spin actuator that rotates the chuck.

According to an embodiment, the reflector and the heating member may be independent from rotation of the chuck.

According to an embodiment, an apparatus for treating a substrate includes a support unit that supports the substrate and a liquid dispensing unit that dispenses a treatment liquid onto the substrate supported on the support unit. The support unit includes a chuck that supports the substrate, a heating member that emits light to heat the substrate supported on the chuck, and a reflector disposed under the heating member. The reflector includes a curved surface that reflects the light toward an edge region of the substrate supported on the chuck.

According to an embodiment, the curved surface may form part of a virtual ellipse when viewed from the front of the support unit.

According to an embodiment, the virtual ellipse may have a first focal point and a second focal point, the center of the heating member may overlap one of the first focal point and the second focal point when viewed from the front, and the edge region of the substrate supported on the chuck may overlap the other one of the first focal point and the second focal point when viewed from the front.

According to an embodiment, the reflector may include a base disposed under the heating member and protrusions protruding upward from the base. The base and/or the protrusions may each include the curved surface, and the curved surfaces may reflect the light toward different positions on the substrate supported on the support unit.

According to an embodiment, the treatment liquid may include a chemical to etch a film on the substrate, and the reflector may be formed of a material containing at least one of aluminum, copper, quartz, gold, or silver.

According to an embodiment, an apparatus for treating a substrate includes a support unit that supports the substrate and a liquid dispensing unit that dispenses a treatment liquid onto the substrate supported on the support unit. The support unit includes a chuck that supports the substrate, a lamp that is provided inside the chuck and that emits light to heat the substrate supported on the chuck, and a reflector that reflects the light toward an edge region of the substrate. The reflector includes a curved surface that forms part of a virtual ellipse having a first focal point and a second focal point, when viewed from the front of the support unit. The first focal point is in agreement with the center of the lamp when viewed from the front, and the second focal point, when viewed from the front, overlaps the edge region of the substrate supported on the chuck.

According to an embodiment, the reflector may include a base disposed under the lamp and protrusions protruding upward from the base and including the curved surface together with the base. The protrusions may have an arc shape, and the protrusions may be spaced apart from each other to form a circular shape when viewed from above.

According to an embodiment, the curved surfaces may reflect the light toward different positions on the substrate supported on the support unit.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
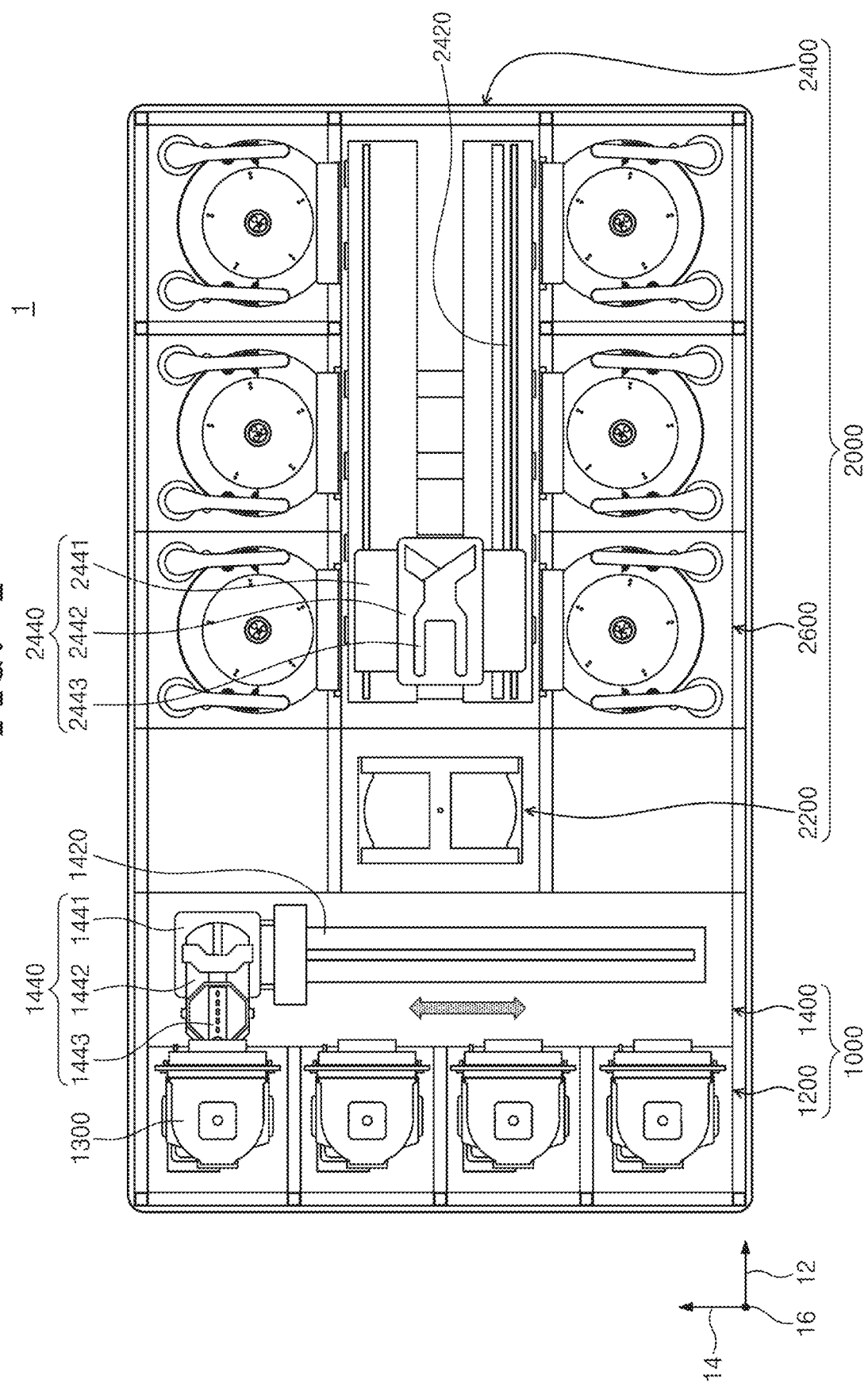
FIG. 1 is a schematic plan view illustrating substrate treating equipment including a substrate treating apparatus according to an embodiment of the inventive concept.

Hereinafter, embodiments of the inventive concept will be described in detail with reference to the accompanying drawings such that those skilled in the art to which the inventive concept pertains can readily carry out the inventive concept. However, the inventive concept may be implemented in various different forms and is not limited to the embodiments described herein. Furthermore, in describing the embodiments of the inventive concept, detailed descriptions related to well-known functions or configurations will be omitted when they may make subject matters of the inventive concept unnecessarily obscure. In addition, components performing similar functions and operations are provided with identical reference numerals throughout the accompanying drawings.

The terms "include" and "comprise" in the specification are "open type" expressions just to say that the corresponding components exist and, unless specifically described to the contrary, do not exclude but may include additional components. Specifically, it should be understood that the terms "include", "comprise", and "have", when used herein, specify the presence of stated features, integers, steps, operations, components, and/or parts, but do not preclude the presence or addition of one or more other features, integers, steps, operations, components, parts, and/or groups thereof.

The terms of a singular form may include plural forms unless otherwise specified. Furthermore, in the drawings, the shapes and dimensions of components may be exaggerated for clarity of illustration.

FIG. 1 is a schematic plan view illustrating substrate treating equipment including a substrate treating apparatus according to an embodiment of the inventive concept. Referring to FIG. 1, the substrate treating equipment 1 includes an index module 1000 and a process module 2000. The index module 1000 includes a load port 1200 and a transfer frame 1400. The load port 1200, the transfer frame 1400, and the process module 2000 are sequentially arranged in a row. Hereinafter, a direction in which the load port 1200, the transfer frame 1400, and the process module 2000 are arranged is referred to as a first direction 12. A direction perpendicular to the first direction 12 when viewed from above is referred to as a second direction 14, and a direction perpendicular to a plane including the first direction 12 and the second direction 14 is referred to as a third direction 16.

A carrier 1300 having substrates W received therein is seated on the load port 1200. A plurality of load ports 1200 may be provided. The load ports 1200 may be disposed in a row along the second direction 14. FIG. 1 illustrates an example that the index module 1000 includes four load ports 1200. However, the number of load ports 1200 may be increased or decreased depending on conditions such as process efficiency and footprint of the process module 2000. Slots (not illustrated) that support edges of the substrates W are formed in the carrier 1300. The slots are provided in the third direction 16. The substrates W are stacked in the carrier 1300 in a state of being spaced apart from each other along the third direction 16. A front opening unified pod (FOUP) may be used as the carrier 1300.

The process module 2000 includes a buffer unit 2200, a transfer chamber 2400, and process chambers 2600. The transfer chamber 2400 is disposed such that the lengthwise direction thereof is parallel to the first direction 12. The process chambers 2600 are disposed on one side and an opposite side of the transfer chamber 2400 along the second direction 14. The process chambers 2600 on the one side of the transfer chamber 2400 and the process chambers 2600 on the opposite side of the transfer chamber 2400 are located in a symmetric arrangement with respect to the transfer chamber 2400. Some of the process chambers 2600 are disposed along the lengthwise direction of the transfer chamber 2400. Furthermore, the other process chambers 2600 are stacked one above another. That is, the process chambers 2600 may be disposed in an A×B array (A and B being natural numbers of 1 or larger) on the one side of the transfer chamber 2400. Here, "A" is the number of process chambers 2600 provided in a row along the first direction 12, and "B" is the number of process chambers 2600 provided in a column along the third direction 16. When four or six process chambers 2600 are provided on the one side of the transfer chamber 2400, the process chambers 2600 may be disposed in a 2×2 or 3×2 array. The number of process chambers 2600 may be increased or decreased. Alternatively, the process chambers 2600 may be provided on only the one side of the transfer chamber 2400. In another case, the process chambers 2600 may be provided in a single layer on the one side and the opposite side of the transfer chamber 2400.

The buffer unit 2200 is disposed between the transfer frame 1400 and the transfer chamber 2400. The buffer unit 2200 provides a space in which the substrates W stay before transferred between the transfer chamber 2400 and the transfer frame 1400. The buffer unit 2200 has a plurality of slots (not illustrated) in which the substrates W are placed. The slots (not illustrated) are spaced apart from each other along the third direction 16. The buffer unit 2200 is open at one face that faces the transfer frame 1400 and at an opposite face that faces the transfer chamber 2400.

The transfer frame 1400 transfers the substrates W between the carriers 1300 seated on the load ports 1200 and the buffer unit 2200. An index rail 1420 and an index robot 1440 are provided in the transfer frame 1400. The index rail 1420 is disposed such that the lengthwise direction thereof is parallel to the second direction 14. The index robot 1440 is installed on the index rail 1420 and is rectilinearly moved along the index rail 1420 in the second direction 14. The index robot 1440 has a base 1441, a body 1442, and an index arm 1443. The base 1441 is movable along the index rail 1420. The body 1442 is coupled to the base 1441. The body 1442 is movable on the base 1441 along the third direction 16. Furthermore, the body 1442 is rotatable on the base 1441. The index arm 1443 is coupled to the body 1442 and is movable forward and backward relative to the body 1442. A plurality of index arms 1443 may be provided. The index arms 1443 may be individually driven. The index arms 1443 are stacked one above another along the third direction 16 with a spacing gap therebetween. Some of the index arms 1443 may be used to transfer the substrates W from the process module 2000 to the carriers 1300, and the other index arms 1443 may be used to transfer the substrates W from the carriers 1300 to the process module 2000. Accordingly, particles generated from the substrates W to be treated may be prevented from adhering to the treated substrates W in a process in which the index robot 1440 transfers the substrates W between the carriers 1300 and the process module 2000.

The transfer chamber 2400 transfers the substrates W between the buffer unit 2200 and the process chambers 2600 and between the process chambers 2600. A guide rail 2420 and a main robot 2440 are provided in the transfer chamber 2400. The guide rail 2420 is disposed such that the lengthwise direction thereof is parallel to the first direction 12. The main robot 2440 is installed on the guide rail 2420 and is rectilinearly moved on the guide rail 2420 along the first direction 12. The main robot 2440 has a base 2441, a body 2442, and a main arm 2443. The base 2441 is movable along the guide rail 2420. The body 2442 is coupled to the base 2441. The body 2442 is movable on the base 2441 along the third direction 16. Furthermore, the body 2442 is rotatable on the base 2441. The main arm 2443 is coupled to the body 2442 and is movable forward and backward relative to the body 2442. A plurality of main arms 2443 may be provided. The main arms 2443 may be individually driven. The main arms 2443 are stacked one above another along the third direction 16 with a spacing gap therebetween. The main arms 2443 used to transfer the substrates W from the buffer unit 2200 to the process chambers 2600 may differ from the main arms 2443 used to transfer the substrates W from the process chambers 2600 to the buffer unit 2200.

The process chambers 2600 include substrate treating apparatuses 10, respectively, which perform cleaning processes on the substrates W. The substrate treating apparatuses 10 included in the respective process chambers 2600 may have different structures depending on the types of cleaning processes performed by the substrate treating apparatuses 10. Selectively, the substrate treating apparatuses 10 in the respective process chambers 2600 may have the same structure. Selectively, the process chambers 2600 may be divided into a plurality of groups. The substrate treating apparatuses 10 in the process chambers 2600 belonging to the same group may have the same structure, and the substrate treating apparatuses 10 in the process chambers 2600 belonging to different groups may have different structures. For example, when the process chambers 2600 are divided into two groups, a first group of process chambers 2600 may be disposed on the one side of the transfer chamber 2400, and a second group of process chambers 2600 may be disposed on the opposite side of the transfer chamber 2400. Selectively, on the one side and the opposite side of the transfer chamber 2400, the first group of process chambers 2600 may be provided in a lower layer, and the second group of process chambers 2600 may be provided in an upper layer. The first group of process chambers 2600 may be distinguished from the second group of process chambers 2600 depending on the types of chemicals used and the types of cleaning methods.

In the following embodiment, an apparatus for cleaning a substrate W using treatment fluids, such as a high-temperature sulfuric acid, an alkaline chemical, an acidic chemical, a rinsing solution, and a drying gas, will be described as an example. However, without being limited thereto, the spirit and scope of the inventive concept are applicable to various types of apparatuses that perform a process, such as an etching process, while rotating a substrate W.

Figure 2:
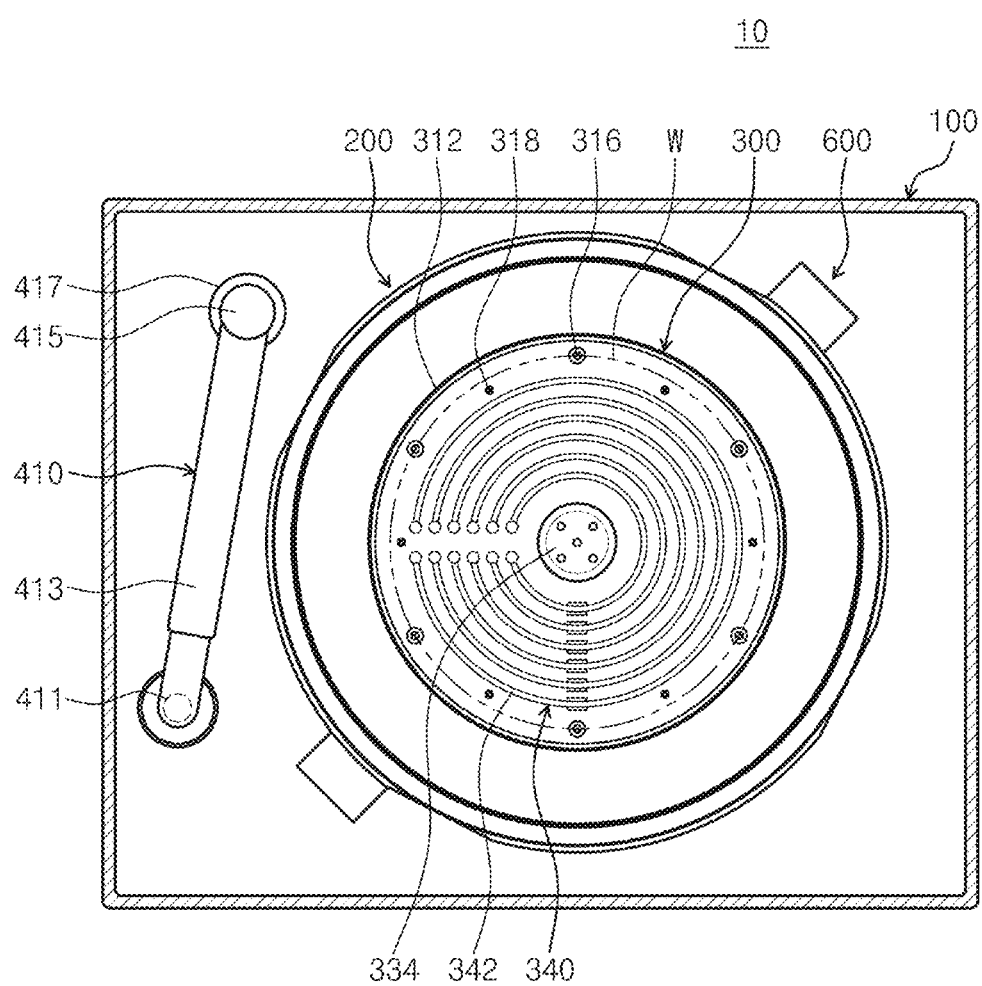
FIG. 2 is a plan view of the substrate treating apparatus of FIG. 1.
Figure 3:
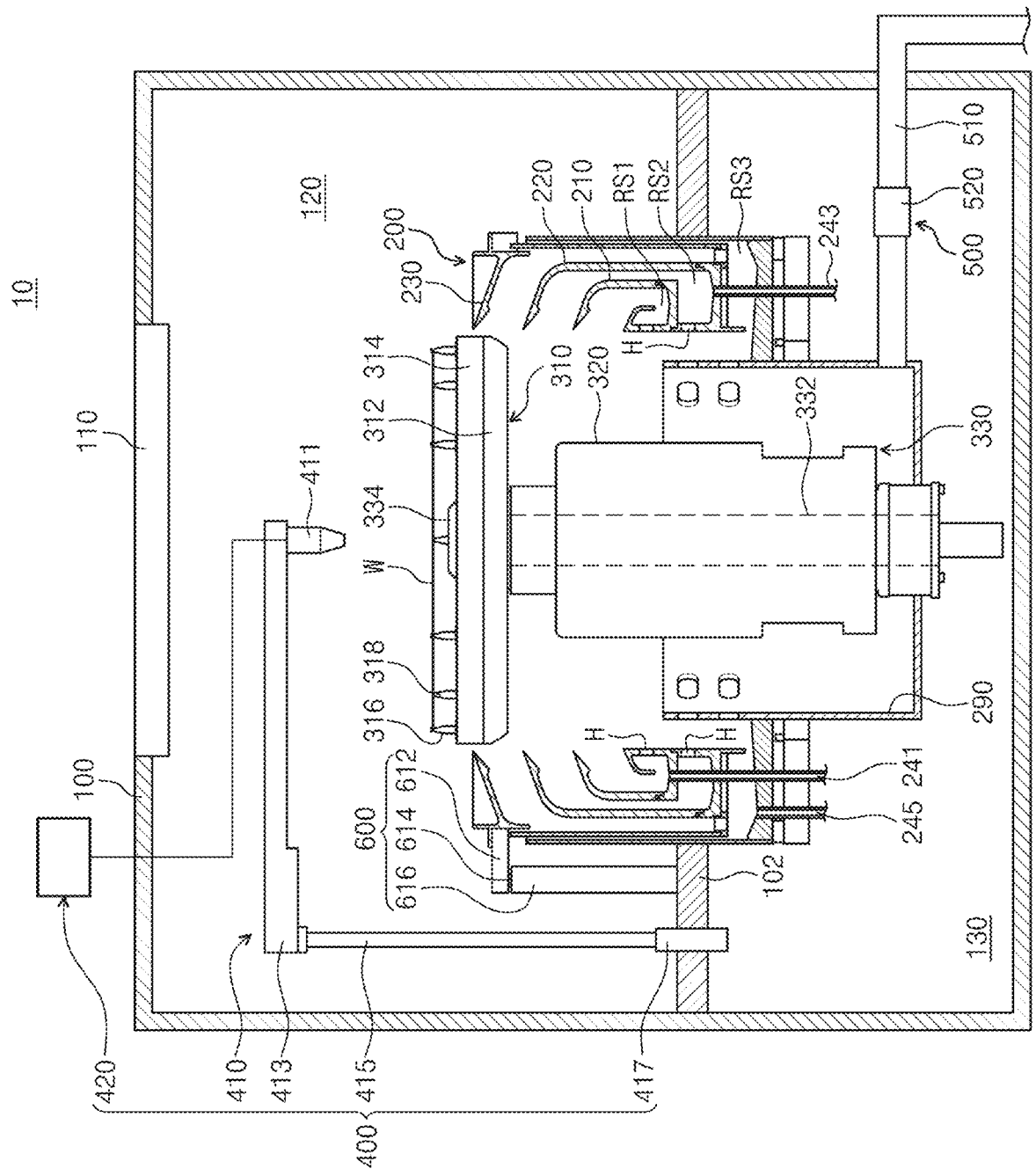
FIG. 3 is a sectional view of the substrate treating apparatus of FIG. 1.

FIG. 2 is a plan view of the substrate treating apparatus of FIG. 1, and FIG. 3 is a sectional view of the substrate treating apparatus of FIG. 1. Referring to FIGS. 2 and 3, the substrate treating apparatus 10 includes a chamber 100, a bowl 200, a support unit 300, a liquid dispensing unit 400, an exhaust unit 500, and a lifting unit 600.

The chamber 100 provides a sealed inner space. The chamber 100 is equipped with an air-flow supply member 110 at the top thereof. The air-flow supply member 110 forms a downward air flow in the chamber 100. The air-flow supply member 110 filters and supplies high-humidity outside air into the chamber 100. The high-humidity outside air passes through the air-flow supply member 110 and forms a downward air flow while being supplied into the chamber 100. The downward air flow provides a uniform air flow over a substrate W and releases contaminants generated in a process of treating a surface of the substrate W with treatment fluids, to the exhaust unit 500 through recovery bowls 210, 220, and 230 of the bowl 200.

The inner space of the chamber 100 is divided into a process area 120 and a maintenance area 130 by a horizontal partition wall 102. The bowl 200 and the support unit 300 are located in the process area 120. In addition to recovery lines 241, 243, and 245 connected with the bowl 200 and an exhaust line 510, an actuator of the lifting unit 600, an actuator of the liquid dispensing unit 400, a supply line, and the like are located in the maintenance area 130. The maintenance area 130 is isolated from the process area 120.

The bowl 200 has an open-topped cylindrical shape and has a process space for treating the substrate W. The open top side of the bowl 200 serves as a passage through which the substrate W is carried into or out of the bowl 200. The support unit 300 is located in the process space. During a process, the support unit 300 rotates the substrate W while supporting the substrate W.

The bowl 200 has, in the bottom thereof, a lower space to which an exhaust duct 290 is connected for forced exhaust. The bowl 200 includes the first recovery bowl 210, the second recovery bowl 220, and the third recovery bowl 230 that are disposed in multiple stages and that take in treatment liquids and gases scattered from the rotating substrate W.

The first recovery bowl 210, the second recovery bowl 220, and the third recovery bowl 230 have exhaust holes H fluidly connected with one common annular space. Specifically, each of the first to third recovery bowls 210, 220, and 230 includes a bottom wall having an annular ring shape and a sidewall extending upward from the bottom wall and having a cylindrical shape. The second recovery bowl 220 surrounds the first recovery bowl 210 and is spaced apart from the first recovery bowl 210. The third recovery bowl 230 surrounds the second recovery bowl 220 and is spaced apart from the second recovery bowl 220.

The first recovery bowl 210, the second recovery bowl 220, and the third recovery bowl 230 may have a first recovery space RS1, a second recovery space RS2, and a third recovery space RS3, respectively, into which an air flow containing the treatment liquids and fumes scattered from the substrate W is introduced. The first recovery space RS1 is defined by the first recovery bowl 210, the second recovery space RS2 is defined by a separation space between the first recovery bowl 210 and the second recovery bowl 220, and the third recovery space RS3 is defined by a separation space between the second recovery bowl 220 and the third recovery bowl 230.

The top side of each of the first recovery bowl 210, the second recovery bowl 220, and the third recovery bowl 230 is open in the center. The first recovery bowl 210, the second recovery bowl 220, and the third recovery bowl 230 each include an inclined wall that is upwardly inclined such that the distance between the inclined wall and the corresponding bottom wall gradually increases from the sidewall to the open top side. The treatment liquids scattered from the substrate W flow into the first recovery space RS1, the second recovery space RS2, and/or the third recovery space RS3 along the top sides of the first recovery bowl 210, the second recovery bowl 220, and the third recovery bowl 230.

A first treatment liquid introduced into the first recovery space RS1 is discharged to the outside through the first recovery line 241. A second treatment liquid introduced into the second recovery space RS2 is discharged to the outside through the second recovery line 243. A third treatment liquid introduced into the third recovery space RS3 is discharged to the outside through the third recovery line 245.

The liquid dispensing unit 400 may dispense the treatment liquids onto the substrate W to treat the substrate W. The liquid dispensing unit 400 may dispense a heated treatment liquid onto the substrate W. The heated treatment liquid may be a high-temperature chemical for treating (e.g., etching) the surface of the substrate W. For example, the chemical may be a sulfuric acid, a phosphoric acid, or a mixture thereof. The liquid dispensing unit 400 may include a liquid nozzle member 410 and a supply unit 420.

The liquid nozzle member 410 may include a nozzle 411, a nozzle arm 413, a support rod 415, and a nozzle actuator 417. The nozzle 411 may receive the treatment liquid from the supply unit 420. The nozzle 411 may dispense the treatment liquid onto the surface of the substrate W. The nozzle arm 413 extends in one direction and is equipped with the nozzle 411 at the tip end thereof. The nozzle arm 413 supports the nozzle 411. The nozzle arm 413 is equipped with the support rod 415 at a rear end thereof. The support rod 415 is located on the bottom of the nozzle arm 413. The support rod 415 is disposed perpendicular to the nozzle arm 413. The nozzle actuator 417 is provided at a lower end of the support rod 415. The nozzle actuator 417 rotates the support rod 415 about the longitudinal axis of the support rod 415. The nozzle arm 413 and the nozzle 411 swing about the support rod 415 by the rotation of the support rod 415. The nozzle 411 may swing between the outside and the inside of the bowl 200. The nozzle 411 may dispense the treatment liquid while swinging between a central region and an edge region of the substrate W.

The exhaust unit 500 may evacuate the inside of the bowl 200. For example, the exhaust unit 500 may apply exhaust pressure (suction pressure) to a recovery bowl that recovers the treatment liquid during a process, among the first recovery bowl 210, the second recovery bowl 220, and the third recovery bowl 230. The exhaust unit 500 may include the exhaust line 510 connected with the exhaust duct 290 and a damper 520. The exhaust line 510 receives exhaust pressure from an exhaust pump (not illustrated) and is connected with a main exhaust line buried in a bottom space of a semiconductor manufacturing line.

The bowl 200 is coupled with the lifting unit 600 that changes the vertical position of the bowl 200. The lifting unit 600 rectilinearly moves the bowl 200 in an up/down direction. As the bowl 200 is moved in the up/down direction, the height of the bowl 200 relative to the support unit 300 is changed.

The lifting unit 600 includes a bracket 612, a movable shaft 614, and an actuator 616. The bracket 612 is fixedly attached to an outer wall of the bowl 200. The movable shaft 614 is fixedly coupled to the bracket 612 and is moved in the up/down direction by the actuator 616. When the substrate W is loaded onto or unloaded from the support unit 300, the bowl 200 is lowered such that the support unit 300 protrudes beyond the bowl 200. Furthermore, during a process, the height of the bowl 200 is adjusted depending on the types of treatment liquids dispensed onto the substrate W, such that the treatment liquids are introduced into the preset recovery bowls 210, 220, and 230, respectively. The bowl 200 may vary the types of treatment liquids and pollutant gases recovered into the respective recovery spaces RS1, RS2, and RS3.

Figure 4:
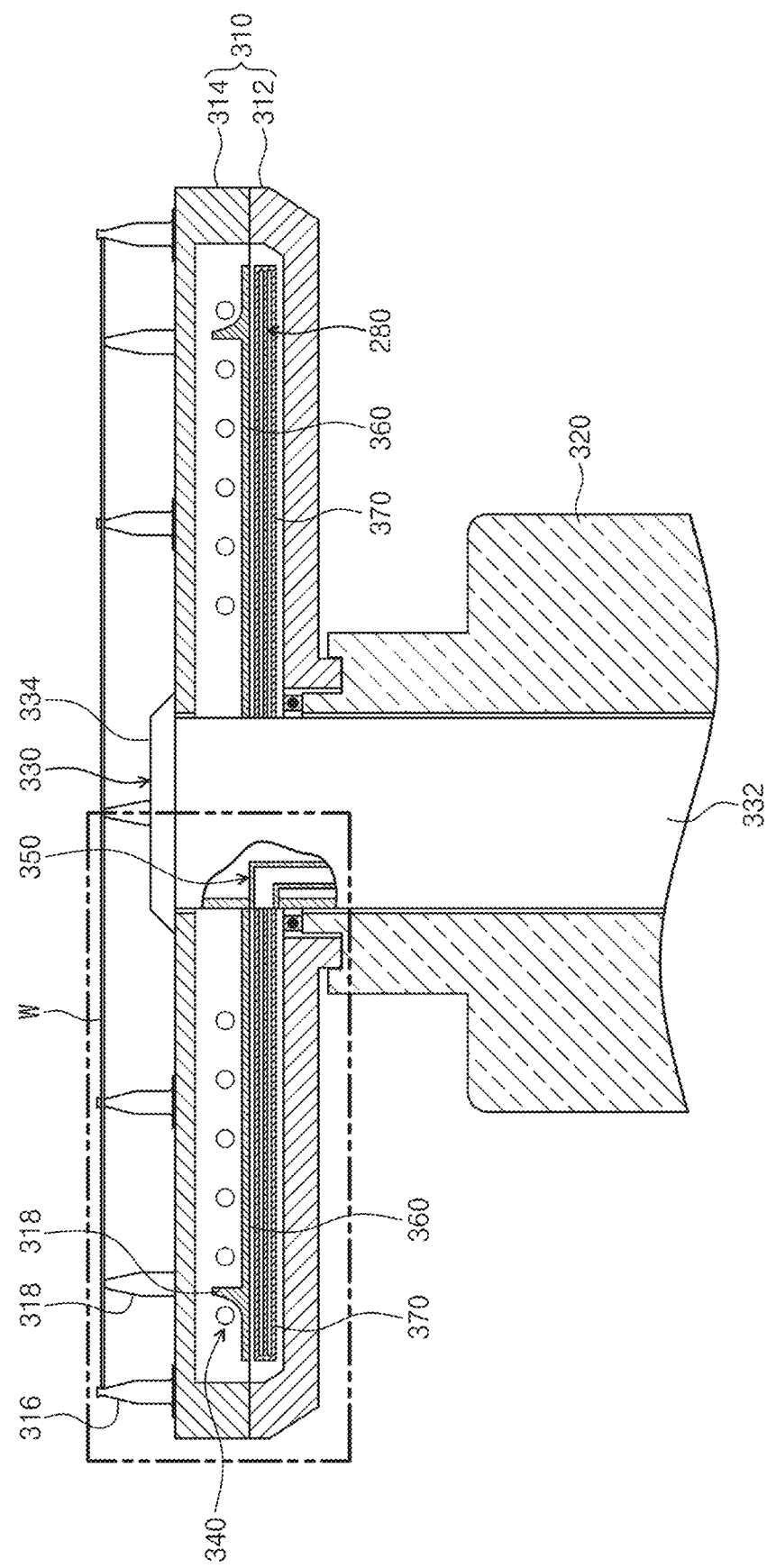
FIG. 4 is a sectional view illustrating one embodiment of a support unit of FIG. 3.
Figure 5:
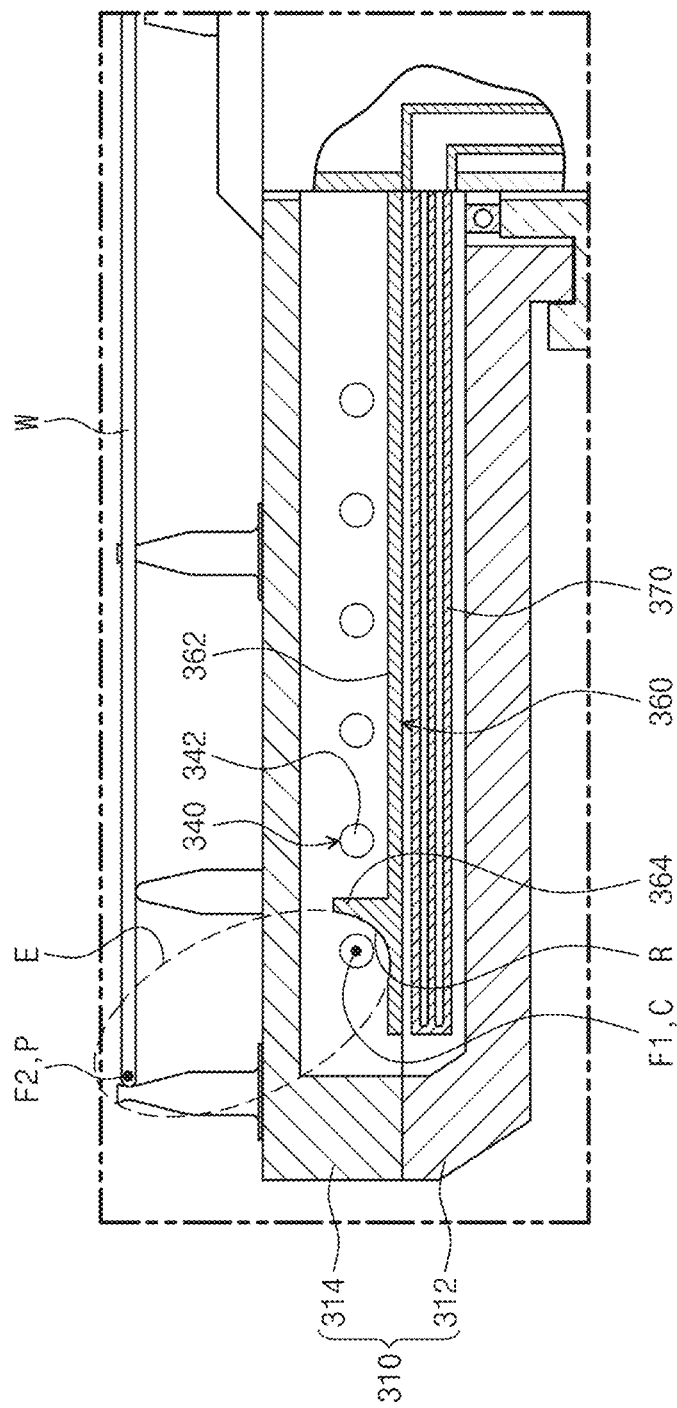
FIG. 5 is an enlarged view illustrating part of the support unit of FIG. 4.

FIG. 4 is a sectional view illustrating one embodiment of the support unit of FIG. 3, and FIG. 5 is an enlarged view illustrating part of the support unit of FIG. 4. Referring to FIGS. 4 and 5, the support unit 300 may support and rotate the substrate W during a process.

The support unit 300 may include a chuck 310, a spin actuator 320, a back nozzle 330, a heating member 340, a cooling member 350, a reflector 360, and a heat dissipation plate 370.

The chuck 310 includes a chuck stage 312 and a quartz window 314. The chuck stage 312 and the quartz window 314 may be combined with each other to form an inner space. For example, the chuck stage 312 may have a cylindrical shape that is open at the top. Furthermore, the quartz window 314 may have a cover shape that covers the chuck stage 312. Accordingly, the chuck stage 312 and the quartz window 314 may be combined with each other to form the inner space.

The chuck stage 312 may be coupled with and rotated by the spin actuator 320. Chucking pins 316 may be installed on an edge region of the quartz window 314. The chucking pins 316 pass through the quartz window 314 and protrude above the quartz window 314. The chucking pins 316 may align the substrate W to locate the substrate W, which is supported by a plurality of support pins 318, in a correct position. During a process, the chucking pins 316 may make contact with a lateral portion of the substrate W to prevent the substrate W from deviating from the correct position.

The quartz window 314 is located over the chuck stage 312. The quartz window 314 protects the heating member 340. The quartz window 314 may be transparent. The quartz window 314 may be rotated together with the chuck stage 312. The quartz window 314 includes the support pins 318. The support pins 318 are disposed on an edge portion of an upper surface of the quartz window 314 and are spaced apart from each other at predetermined intervals. The support pins 318 protrude upward from the quartz window 314. The support pins 318 support a lower surface of the substrate W and space the substrate W apart upward from the quartz window 314.

The spin actuator 320 has a hollow shape. The spin actuator 320 is coupled with the chuck stage 312 and rotates the chuck stage 312. When the chuck stage 312 is rotated, the quartz window 314 may be rotated together with the chuck stage 312. Furthermore, components inside the chuck 310 may be located independently from the rotation of the chuck 310. For example, the heating member 340, the reflector 360, and the heat dissipation plate 370, which will be described below, may be located independently from the rotation of the chuck 310.

The back nozzle 330 dispenses a chemical onto the lower surface of the substrate W. The back nozzle 330 includes a nozzle body 332 and a chemical dispensing part 334. The chemical dispensing part 334 is located on a central portion of the quartz window 314. The nozzle body 332 may be axially inserted through the hollow spin actuator 320. The nozzle body 332 may have a chemical delivery line, a gas supply line, and a purge gas supply line therein. The chemical delivery line supplies an etchant for etching the lower surface of the substrate W to the chemical dispensing part 334. The gas supply line supplies a nitrogen gas for adjustment of etch uniformity to the lower surface of the substrate W. The purge gas supply line supplies a nitrogen purge gas to prevent the etchant from infiltrating between the quartz window 314 and the nozzle body 332.

The heating member 340 may heat the substrate W during a process. The heating member 340 may be disposed inside the chuck 310. For example, the heating member 340 may be disposed in the inner space of the chuck 310 defined by a combination of the chuck stage 312 and the quartz window 314. The heating member 340 includes a lamp 342 and a temperature controller (not illustrated).

The lamp 342 is installed over the chuck stage 312. The lamp 342 may generate thermal energy to heat the substrate W supported on the support unit 300. The lamp 342 may heat the substrate W by applying light to the substrate W supported on the support unit 300. The lamp 342 may have a ring shape. A plurality of lamps 342 may be provided. The lamps 342 may have different diameters. The lamps 342 may be controlled by temperature controllers, respectively. The lamps 342 may be infrared (IR) lamps. The lamps 342 may emit infrared light to heat the substrate W.

The heating member 340 may be divided into a plurality of concentric sections. The lamps 342 may be provided in the sections to individually heat the sections, respectively. At least some of the lamps 342 may have a ring shape. The lamps 342 may have different radii with respect to the center of the chuck stage 312 and may be concentric with one another. Although six lamps 342 are illustrated in this embodiment, this is merely illustrative, and the number of lamps 342 may be increased or decreased depending on the degree to which the temperature of the substrate W is controlled to a desired temperature. The heating member 340 may continuously raise or lower temperature depending on the radius of the substrate W during a process, by controlling the temperatures of the individual sections.

The cooling member 350 may supply a cooling fluid into the chuck 310. For example, the cooling member 350 may supply the cooling fluid into a fluid channel formed inside the heat dissipation plate 370 that will be described below. The cooling fluid may be a gas. The cooling fluid may be an inert gas. For example, the cooling fluid may be an inert gas containing nitrogen.

The reflector 360 may reflect thermal energy generated by the heating member 340 toward the substrate W. The reflector 360 may reflect the thermal energy generated by the heating member 340 toward the edge region and/or the central region of the substrate W. The reflector 360 may be formed of a material having high reflection efficiency for the thermal energy generated by the heating member 340. The reflector 360 may be formed of a material having high reflection efficiency for light emitted by the lamps 342. For example, the reflector 360 may be formed of a material containing gold, silver, copper, and/or aluminum. The reflector 360 may be formed of a material obtained by coating quartz with gold, silver, copper, and/or aluminum. The reflector 360 may be formed of a material obtained by coating quartz with gold, silver, copper, and/or aluminum by physical vapor deposition (PVD).

The heat dissipation plate 370 may be disposed inside the chuck 310. The heat dissipation plate 370 may be disposed in the inner space formed by the chuck stage 312 and the quartz window 314. The heat dissipation plate 370 may have a substantially circular plate shape when viewed from above. The heat dissipation plate 370 may have a cooling line formed therein through which the cooling fluid supplied by the cooling member 350 flows. The heat dissipation plate 370 may be formed of a material having high thermal conductivity to minimize a temperature rise of the spin actuator 320 by heat generated from the heating member 340. When the heat dissipation plate 370 is formed of a material having high thermal conductivity, the heat dissipation plate 370 may rapidly release heat outside the support unit 300. This is to prevent the spin actuator 320 from inappropriately operating when the temperature of the spin actuator 320 is excessively high. The heat dissipation plate 370 may be formed of a material containing aluminum. Furthermore, the heat dissipation plate 370 may be formed of a material having higher thermal conductivity than the reflector 360.

The reflector 360 may be disposed inside the chuck 310. The reflector 360 may be disposed in the inner space formed by a combination of the chuck stage 312 and the quartz window 314. The reflector 360 may have a substantially circular plate shape when viewed from above. For example, the reflector 360, when viewed from above, may have a circular plate shape having an opening in a central region thereof.

The reflector 360 may include a base 362 and a protrusion 364. The base 362 may be disposed under the heating member 340. The base 362 may be disposed under the lamps 342. The protrusion 364 may protrude upward from the base 362. The protrusion 364 may be disposed between two lamps adjacent to each other among the lamps 342. For example, the protrusion 364, when viewed from above, may be disposed between the outermost lamp 342 among the lamps 342 and a lamp 342 most adjacent to the outermost lamp 342. The protrusion 364 may have an arc shape when viewed from above. Furthermore, a plurality of protrusions 364 may be provided. The protrusions 364, when viewed from above, may be combined together to form a ring shape.

A surface of at least part of the base 362 and/or a surface of at least part of the protrusion 364 may be curved. For example, a surface of the base 362 that faces the heating member 340 and/or a surface of the protrusion 364 that faces the heating member 340 may be curved. For example, a surface of the base 362 and/or the protrusion 364 may include a curved surface R that reflects light emitted from the lamps 342 toward the edge region of the substrate W. For example, a surface of the base 362 and a surface of the protrusion 364 may be combined with each other to form the curved surface R. The curved surface R may form part of a virtual circle when viewed from the front of the support unit 300. For example, the curved surface R may form part of a virtual ellipse E when viewed from the front of the support unit 300.

Figure 6:
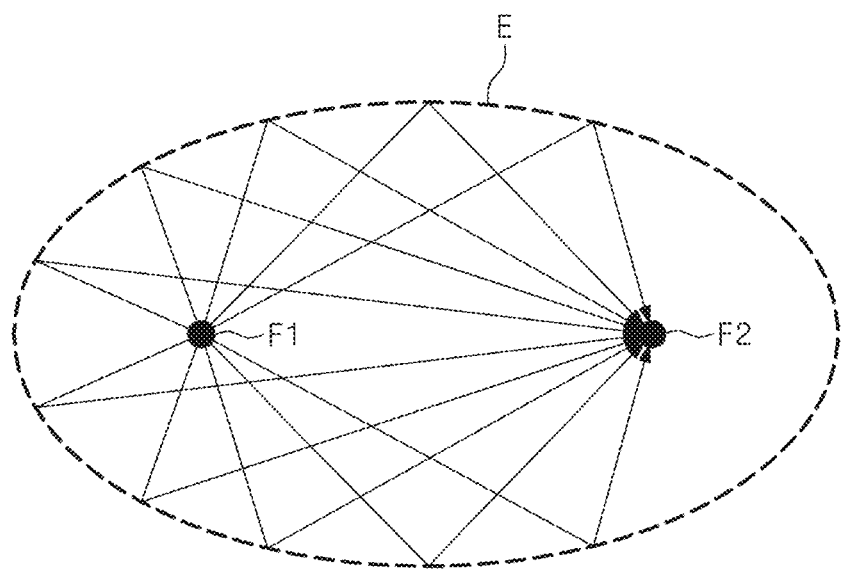
FIG. 6 is a view illustrating a virtual ellipse of FIG. 5.

FIG. 6 is a view illustrating the virtual ellipse of FIG. 5. Referring to FIG. 6, the virtual ellipse E may have two focal points. For example, the virtual ellipse E may have a first focal point F1 and a second focal point F2. The virtual ellipse E has an optical property by which when light emitted from one of the focal points F1 and F2 of the virtual ellipse E is reflected by a reflective surface forming part of the virtual ellipse E, the reflected light is necessarily directed toward the other one of the focal points F1 and F2. For example, when light emitted from the first focal point F1 is reflected by a reflective surface forming part of the virtual ellipse E, the reflected light is necessarily directed toward the second focal point F2. The reflector 360 according to the embodiment of the inventive concept improves heating efficiency for the edge region of the substrate W by using the optical property of the ellipse E.

Figure 7:
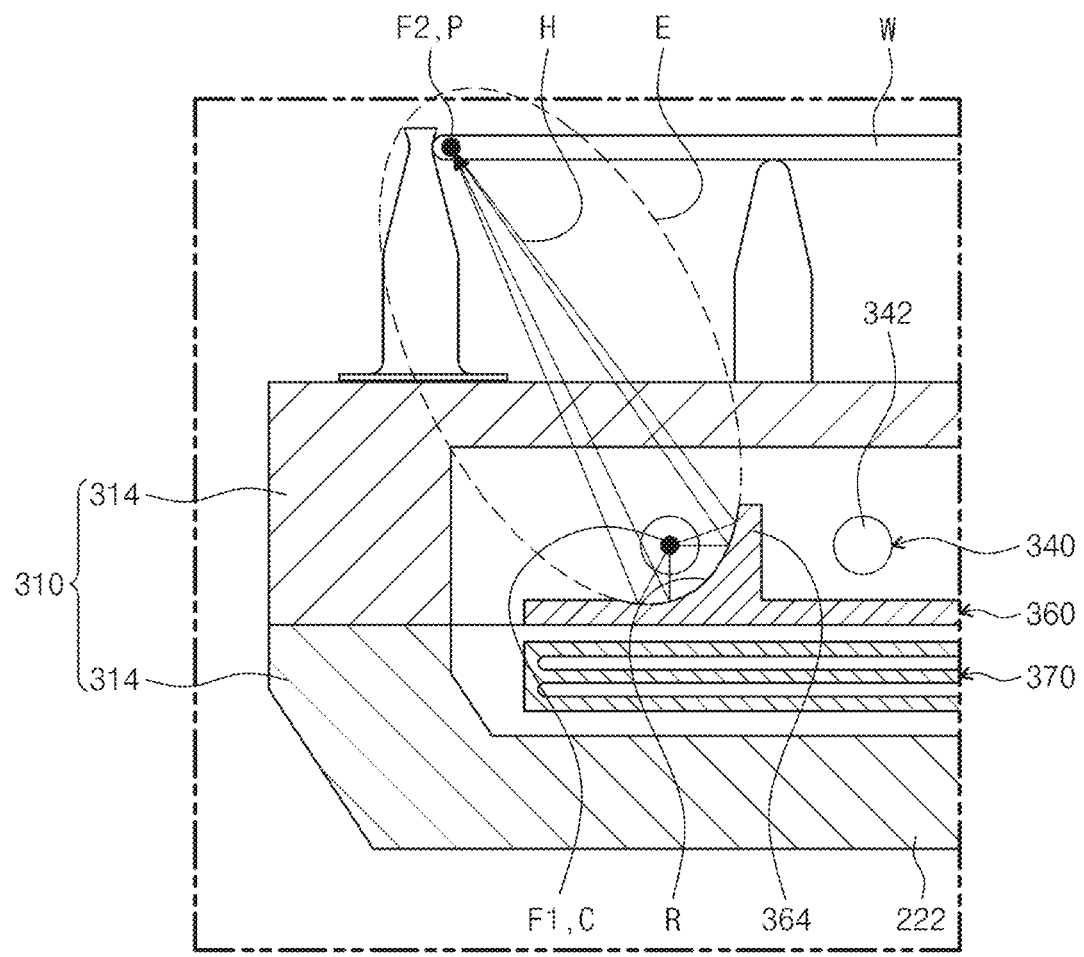
FIG. 7 is a view illustrating a state in which a heating member of FIG. 6 heats a substrate.

For example, referring to FIG. 7, the virtual ellipse E may have the first focal point F1 and the second focal point F2. When viewed from the front of the support unit 300, the heating member 340 may be located to overlap one of the first focal point F1 and the second focal point F2. For example, the center C of a lamp 342 of the heating member 340 may be in agreement with the first focal point F1 when viewed from the front of the support unit 340. Furthermore, the edge region of the substrate W supported on the support unit 300 may overlap the other one of the first focal point F1 and the second focal point F2. For example, the edge region of the substrate W may overlap the second focal point F2 when viewed from the front of the support unit 300. In FIG. 7, the position at which the second focal point F2 and the edge region of the substrate W overlap each other is defined as a heating position P.

When the lamp 342 emits light to heat the substrate W, the light emitting from the lamp 342 may be directly applied to the substrate W and may be indirectly applied to the substrate W by being reflected from a reflective surface of the reflector 360. As described above, the curved surface R formed by the base 342 and the protrusion 364 of the reflector 360 forms part of the virtual ellipse E. Accordingly, when light emitted from the lamp 342 is reflected by the curved surface R, the reflected light is necessarily directed toward the second focal point F2, specifically, the heating position P. In other words, the inventive concept includes the curved surface R forming part of the virtual ellipse E that has the first focal point F1 at which the lamp 342 is located and the second focal point F2 that the edge region of the substrate W overlaps. Accordingly, light emitted from the lamp 342 at the first focal point F1 is reflected by the reflector 360 and directed toward the second focal point F2, and thus heat may be concentrated on the edge region of the substrate W.

Figure 8:
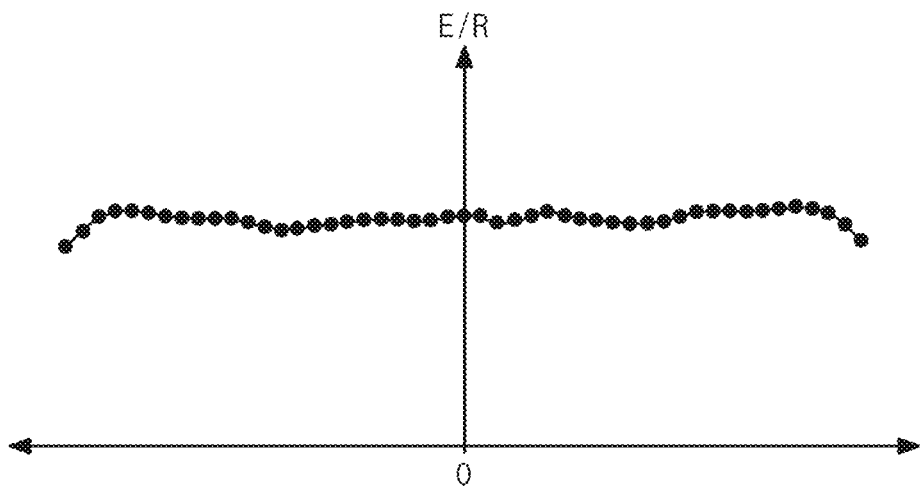
FIG. 8 is a view illustrating an etch rate depending on a distance from the center of a substrate when a general substrate treating apparatus treats the substrate.
Figure 9:
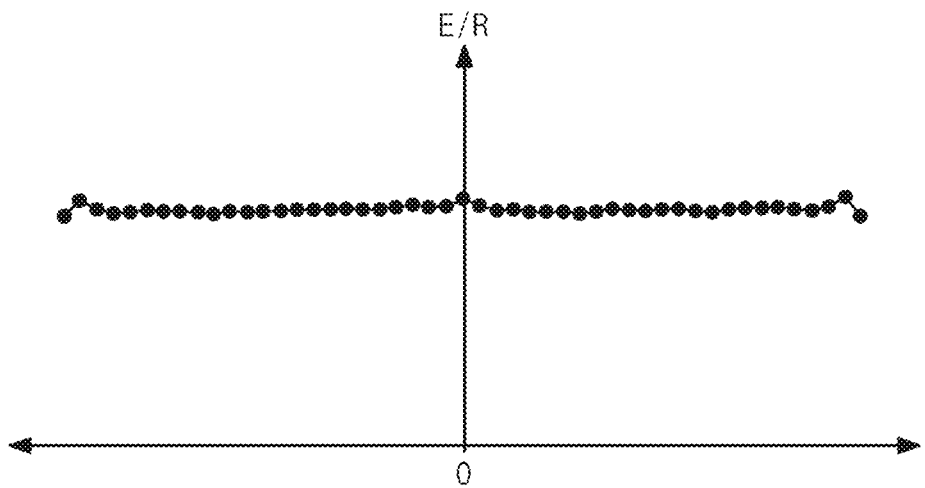
FIG. 9 is a view illustrating an etch rate depending on a distance from the center of a substrate when the substrate treating apparatus according to the embodiment of the inventive concept treats the substrate.

FIG. 8 is a view illustrating an etch rate depending on a distance from the center of a substrate when a general substrate treating apparatus treats the substrate, and FIG. 9 is a view illustrating an etch rate depending on a distance from the center of a substrate when the substrate treating apparatus according to the embodiment of the inventive concept treats the substrate. Referring to FIG. 8, it can be seen that when the general substrate treating apparatus treats the substrate, the etch rate is slightly lowered with an approach to the edge region of the substrate. This is because the number of lamps contributing to heating the edge region of the substrate is smaller than the number of lamps contributing to heating the central region of the substrate. In contrast, as illustrated in FIG. 9, when the substrate treating apparatus according to the embodiment of the inventive concept treats the substrate, the substrate treating apparatus enables concentration of heat on the edge region of the substrate, thereby preventing a drop in etch rate in the edge region of the substrate. This is because infrared light emitted from the outermost lamp 342 is reflected by the curved surface R of the reflector 360 so that heat is concentrated on the edge region of the substrate. That is, the substrate treating apparatus according to the embodiment of the inventive concept may effectively improve substrate treating uniformity.

Figure 10:
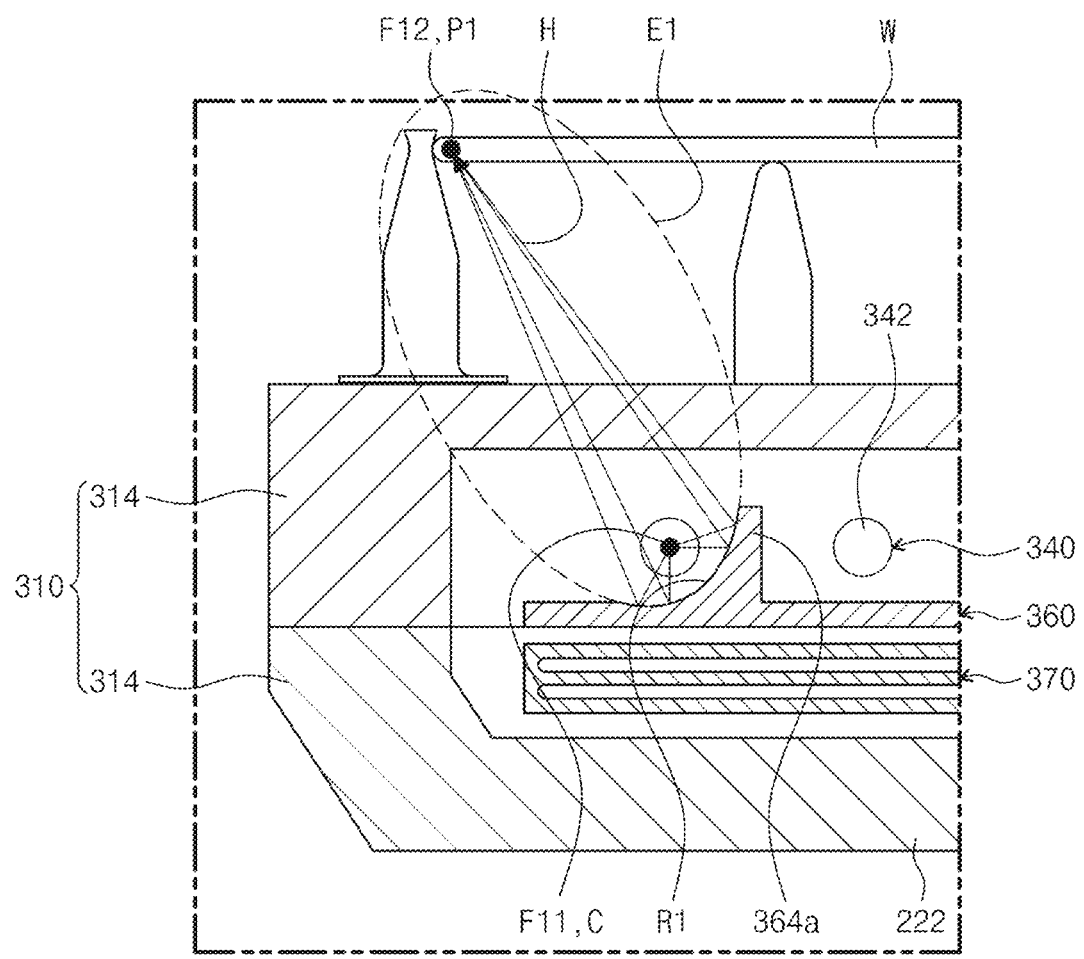
FIGS. 10 to 12 are enlarged views illustrating part of a support unit according to another embodiment of the inventive concept.
Figure 11:
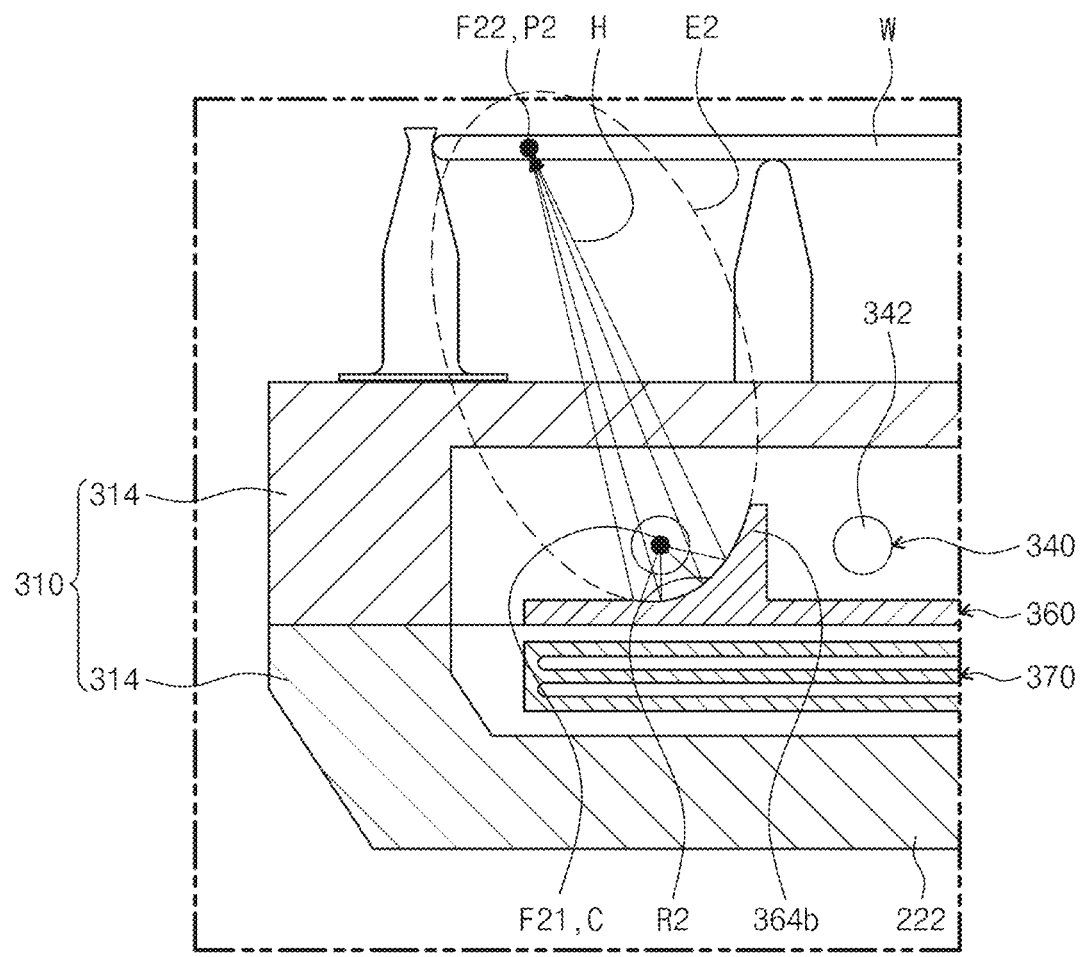
Figure 12:
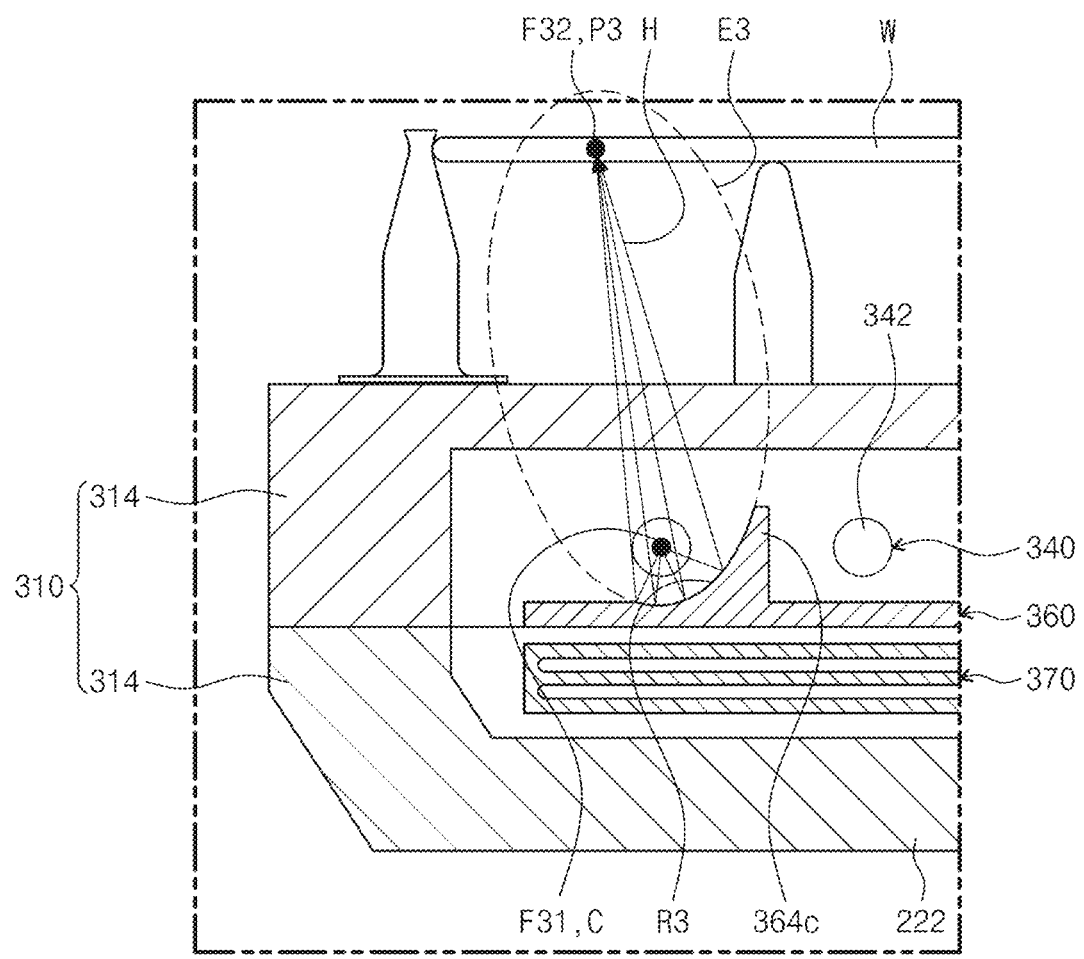

FIGS. 10 to 12 are enlarged views illustrating part of a support unit according to another embodiment of the inventive concept. Referring to FIGS. 10 to 12, a reflector 360 according to the other embodiment of the inventive concept may include a plurality of protrusions 364a, 364b, and 364c. For example, the protrusions 364a, 364b, and 364c may include the first protrusion 364a, the second protrusion 364b, and the third protrusion 364c.

The first protrusion 364a, when viewed from the front of the support unit 300, may include a first curved surface R1 forming part of a first virtual ellipse E1. The second protrusion 364b, when viewed from the front of the support unit 300, may include a second curved surface R2 forming part of a second virtual ellipse E2. The third protrusion 364c, when viewed from the front of the support unit 300, may include a third curved surface R3 forming part of a third virtual ellipse E3. Furthermore, part of each of the first to third curved surfaces R1, R2, and R3 may be defined by part of a surface of a base 362.

The first virtual ellipse E1, the second virtual ellipse E2, and the third virtual ellipse E3 may have different focal points (shapes). For example, the first virtual ellipse E1 may have focal point 1-1 F11 and focal point 1-2 F12. The second virtual ellipse E2 may have focal point 2-1 F21 and focal point 2-2 F22. The third virtual ellipse E3 may have focal point 3-1 F31 and focal point 3-2 F32. Furthermore, the center C of a lamp 342 may be in agreement with focal point 1-1 F11, focal point 2-1 F21, and focal point 3-1 F31.

Light reflected by the first curved surface R1 of the first protrusion 364a may be concentrated on a first heating position P1 at which focal point 1-2 F12 and a substrate W overlap each other. Light reflected by the second curved surface R2 of the second protrusion 364b may be concentrated on a second heating position P2 at which focal point 2-2 F22 and the substrate W overlap each other. Light reflected by the third curved surface R3 of the third protrusion 364c may be concentrated on a third heating position P3 at which focal point 3-2 F32 and the substrate W overlap each other.

Figure 13:
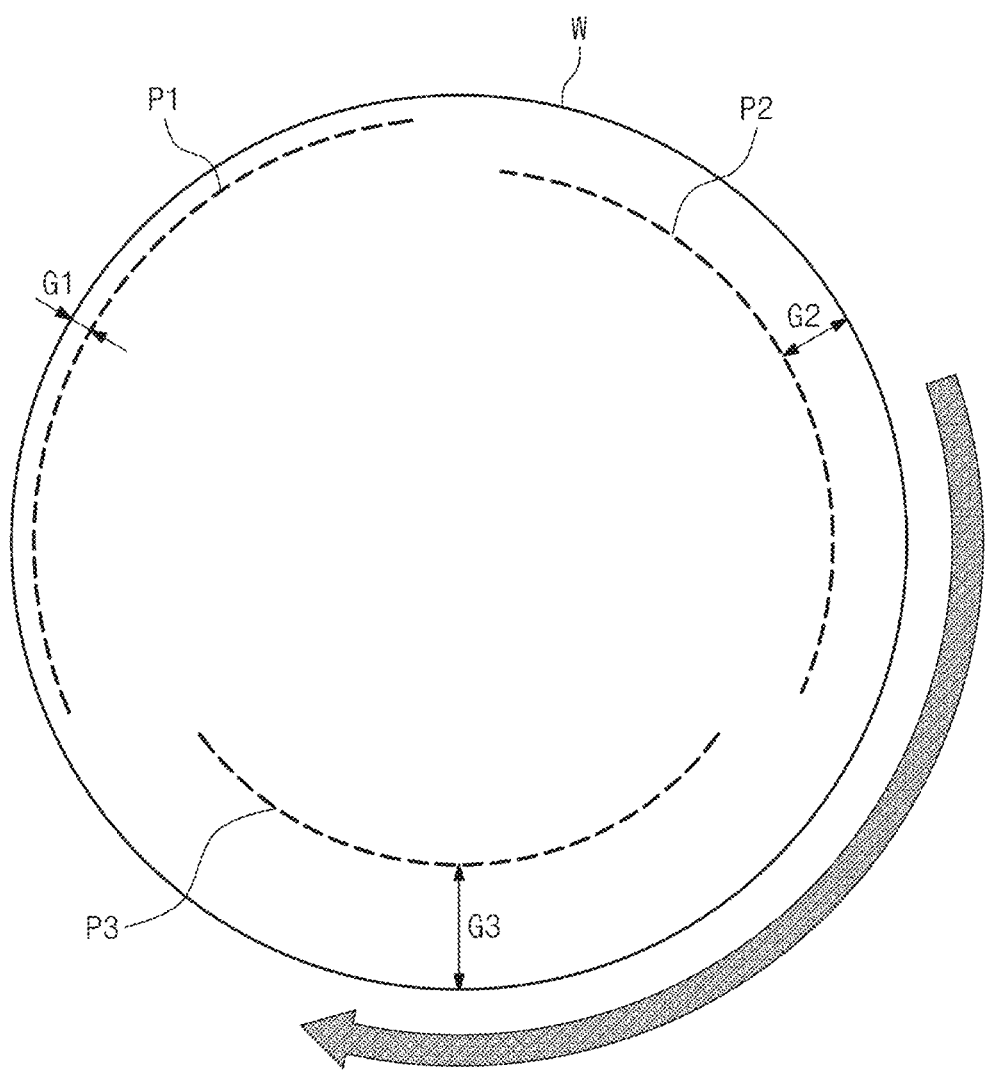
FIG. 13 is a view illustrating positions on a substrate that light reflected by protrusions of FIGS. 10 to 12 reaches.

The first heating position P1, the second heating position P2, and the third heating position P3 may be different positions in an edge region of the substrate W. For example, as illustrated in FIG. 13, the first heating position P1 may be a position spaced apart from the edge of the substrate W by a first gap G1. The second heating position P2 may be a position spaced apart from the edge of the substrate W by a second gap G2. The third heating position P3 may be a position spaced apart from the edge of the substrate W by a third gap G3. The first gap G1 may be 1 mm. The second gap G2 may be 2 mm. The third gap G3 may be 4 mm. As illustrated in FIG. 13, the first protrusion 364a, the second protrusion 364b, and the third protrusion 364c may have an arc shape and may be spaced apart from each other when viewed from above. Furthermore, the first protrusion 364a, the second protrusion 364b, and the third protrusion 364c, when viewed from above, may be combined together to form a circular shape. For example, when viewed from above, the first protrusion 364a, the second protrusion 364b, and the third protrusion 364c may have arc shapes that have the same center and different diameters.

Figure 14:
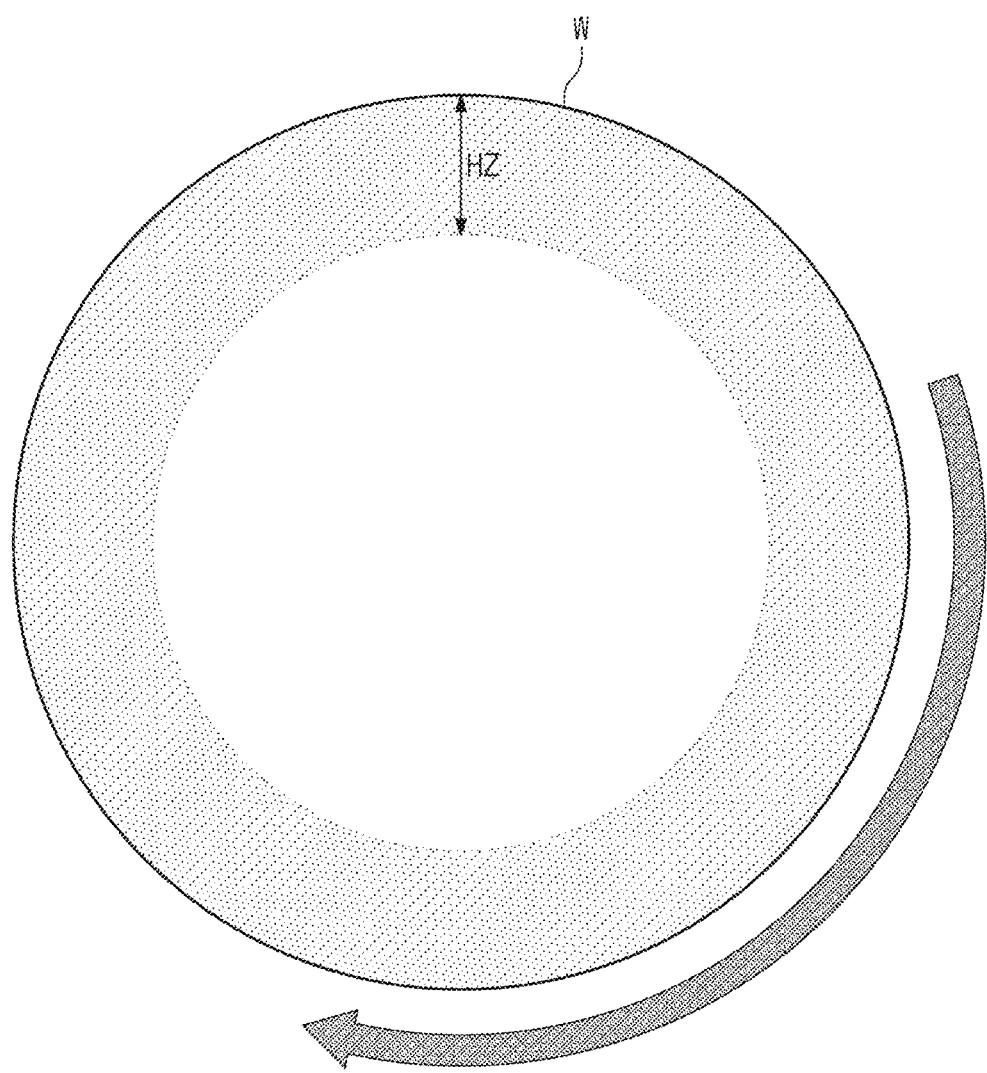
FIG. 14 is a view illustrating a state in which light reflected by the protrusions of FIGS. 10 to 12 reaches an edge region of a substrate and heats the edge region of the substrate.

According to the other embodiment of the inventive concept, light reflected by the first protrusion 364a, the second protrusion 364b, and the third protrusion 364c may reach different positions on the substrate W. Furthermore, as illustrated in FIG. 14, when the substrate W is rotated while being heated, a heating zone HZ where heat is concentrated on the edge region of the substrate W by the reflector 360 is widened. Accordingly, substrate treating efficiency for the edge region of the substrate W may be improved.

As described above, according to the embodiments of the inventive concept, the support unit and the substrate treating apparatus may efficiently treat a substrate.

Furthermore, according to the embodiments of the inventive concept, the support unit and the substrate treating apparatus may improve uniformity in treating a substrate.

Moreover, according to the embodiments of the inventive concept, the support unit and the substrate treating apparatus may improve efficiency in treating an edge region of a substrate.

In addition, according to the embodiments of the inventive concept, the support unit and the substrate treating apparatus may improve an etch rate for an edge region of a substrate.

Effects of the inventive concept are not limited to the above-described effects, and any other effects not mentioned herein may be clearly understood from this specification and the accompanying drawings by those skilled in the art to which the inventive concept pertains.

The above description exemplifies the inventive concept. Furthermore, the above-mentioned contents describe embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A support apparatus for supporting a substrate, the support apparatus comprising:
   a plurality of heating lamps; and
   a reflector,
   wherein the reflector includes a curved surface configured to reflect thermal energy generated by at least one of the heating lamps toward an edge region of the substrate,
   wherein the reflector includes:
      a base disposed under the plurality of heating lamps; and
      a protrusion protruding upward from the base,
   wherein the protrusion includes the curved surface,
   wherein the protrusion is arranged between an outermost heating lamp and an adjacent heating lamp to the outermost heating lamp, and
wherein the curved surface is configured to face a perimeter of the substrate,
wherein the protrusion includes:
a first protrusion including a first curved surface configured to reflect the thermal energy toward a first position on the edge region of the substrate; and
a second protrusion including a second curved surface configured to reflect the thermal energy toward a second position on the edge region of the substrate, the second position being different from the first position.

2. The support apparatus of claim 1, wherein the curved surface forms part of a virtual ellipse when the support apparatus is viewed from a front side view.

3. The support apparatus of claim 2, wherein the virtual ellipse has a first focal point and a second focal point, and
wherein the outermost heating lamp is located to overlap one of the first focal point and the second focal point when viewed from the front side view.

4. The support apparatus of claim 3, wherein the edge region of the substrate overlaps the other one of the first focal point and the second focal point when viewed from the front side view.

5. The support apparatus of claim 1, wherein the adjacent heating lamp to the outermost heating lamp is a lamp closest to the outermost heating lamp.

6. The support apparatus of claim 5, wherein at least some of the plurality of heating lamps have ring shapes with different radii and are concentric with one another.

7. The support apparatus of claim 6,
wherein the base and the protrusion includes the curved surface.

8. The support apparatus of claim 1, wherein the first curved surface forms part of a first virtual ellipse when viewed from a front side view, and
wherein the second curved surface, when viewed from the front side view, forms part of a second virtual ellipse having different focal points from the first virtual ellipse.

9. The support apparatus of claim 8, wherein the support apparatus further comprises:
a chuck configured to support the substrate; and
a spin actuator configured to rotate the chuck.

10. The support apparatus of claim 9, wherein the reflector and the plurality of heating lamps are independent from rotation of the chuck.

11. An apparatus for treating a substrate, the apparatus comprising:
a support plate configured to support the substrate; and
a liquid supplier configured to dispense a treatment liquid onto the substrate supported on the support plate,
wherein the support plate includes:
a chuck configured to support the substrate;
a plurality of heating lamps configured to emit light to heat the substrate supported on the chuck; and
a reflector,
wherein the reflector includes a curved surface configured to reflect the light generated by at least one of the heating lamps towards an edge region of the substrate supported on the chuck,
wherein the reflector includes:
a base disposed under the heating lamps; and
a protrusion protruding upward from the base,
wherein the protrusion includes the curved surface,
wherein the protrusion is arranged between an outermost heating lamp and an adjacent heating lamp to the outermost heating lamp, and
wherein the curved surface is configured to face a perimeter of the substrate,
wherein the protrusion includes:
a first protrusion including a first curved surface configured to reflect thermal energy toward a first position on the edge region of the substrate; and
a second protrusion including a second curved surface configured to reflect the thermal energy toward a second position on the edge region of the substrate, the second position being different from the first position.

12. The apparatus of claim 11, wherein the curved surface forms part of a virtual ellipse when viewed from a front side view of the support plate.

13. The apparatus of claim 12, wherein the virtual ellipse has a first focal point and a second focal point,
wherein the center of the outermost heating lamp overlaps one of the first focal point and the second focal point when viewed from the front side view, and
wherein the edge region of the substrate supported on the chuck overlaps the other one of the first focal point and the second focal point when viewed from the front side view.

14. The apparatus of claim 13,
wherein the base and the protrusions each include the curved surface.

15. The apparatus of claim 13, wherein the treatment liquid includes a chemical to etch a film on the substrate, and
wherein the reflector is formed of a material containing at least one of aluminum, copper, quartz, gold, or silver.

16. An apparatus for treating a substrate, the apparatus comprising:
a support plate configured to support the substrate; and
a liquid supplier configured to dispense a treatment liquid onto the substrate supported on the support plate,
wherein the support plate includes:
a chuck configured to support the substrate;
a plurality of heating lamps provided inside the chuck and configured to emit light to heat the substrate supported on the chuck; and
a reflector configured to reflect the light toward an edge region of the substrate,
wherein the reflector includes a curved surface configured to form part of a virtual ellipse having a first focal point and a second focal point, when viewed from a front side view of the support plate,
wherein the reflector includes:
a base disposed under the plurality of heating lamps; and
a protrusion protruding upward from the base,
wherein the protrusion includes the curved surface and the curved surface is configured to face a perimeter of the substrate,
wherein the protrusion is arranged between an outermost heating lamp and an adjacent heating lamp to the outermost heating lamp,
wherein the first focal point is in agreement with the center of the outermost heating lamp when viewed from the front side view, and
wherein the second focal point, when viewed from the front side view, overlaps the edge region of the substrate supported on the chuck,
wherein the protrusion includes:
a first protrusion including a first curved d surface configured to reflect thermal energy toward a first position on the edge region of the substrate; and
a second protrusion including a second curved surface configured to reflect the thermal energy toward a second position on the edge region of the substrate, the second position being different from the first position.

17. The apparatus of claim 16,
wherein the first protrusion and the second protrusion protruding upward from the base and including the curved surface together with the base,
wherein the first protrusion and the second protrusion have an arc shape, and
wherein the first and the second protrusion are spaced apart from each other to form a circular shape when viewed from above.

18. The apparatus of claim 17, wherein the curved surfaces reflect the light toward different positions on the substrate supported on the support plate.

\* \* \* \* \*